United States Patent [19]

Thrush

[11] 4,115,223

[45] Sep. 19, 1978

[54] GALLIUM ARSENIDE PHOTOCATHODES

[75] Inventor: Edward John Thrush, Stansted Mountfitchet, England

[73] Assignee: International Standard Electric Corporation, New York, N.Y.

[21] Appl. No.: 822,580

[22] Filed: Aug. 8, 1977

Related U.S. Application Data

[63] Continuation of Ser. No. 641,123, Dec. 15, 1975, abandoned.

[51] Int. Cl.[2] .......... C25F 3/02; C25F 3/14; H01L 27/12; H01L 21/36

[52] U.S. Cl. .......... 204/129.6; 204/129.3; 29/572; 29/580

[58] Field of Search .......... 204/129.3, 129.6; 65/40, 42, 43, DIG. 4; 313/94; 29/572, 576 J, 580

[56] References Cited

U.S. PATENT DOCUMENTS

| | | | |
|---|---|---|---|
| 2,920,785 | 1/1960 | Veres | 65/43 |
| 3,117,067 | 1/1964 | Jacobs | 204/129.6 |
| 3,254,013 | 5/1966 | Williams | 204/224 M |
| 3,383,760 | 5/1968 | Shwartzman | 29/576 J |
| 3,409,534 | 11/1968 | Andrews et al. | 204/129.6 |
| 3,536,600 | 2/1968 | Van Dijk et al. | 204/129.3 |
| 3,706,645 | 12/1972 | Lasser | 204/129.3 |
| 3,769,536 | 10/1973 | Antypas | 313/94 |
| 3,959,098 | 5/1976 | Schwartz | 204/129.3 |
| 3,960,620 | 6/1976 | Ettenberg | 29/572 X |

*Primary Examiner*—John H. Mack
*Assistant Examiner*—D. R. Valentine
*Attorney, Agent, or Firm*—John T. O'Halloran; Peter C. Van Der Sluys

[57] ABSTRACT

This invention comprises methods and apparatus for bonding a transmission type III-V photocathode to a transparent substrate. An R.F. susceptor arrangement produces a marked temperature gradient for allowing the surface of the glass to conform to the shape of the semiconductor material without softening the bulk of the glass. The bonded assembly is then carefully annealed in an annealing furnace.

16 Claims, 5 Drawing Figures

GALLIUM ARSENIDE PHOTOCATHODES

CROSS-REFERENCE TO RELATED APPLICATIONS

This is a continuation of application Ser. No. 641,123 filed Dec. 15, 1975, now abandoned.

BACKGROUND OF THE INVENTION

This invention relates to III-V semiconductor photocathodes of the transmission type in which light may be directed upon one side of the device in order to produce photon excited electron emission from the opposite side. In particular the invention is concerned with providing such a device with a glass supporting substrate.

SUMMARY OF THE INVENTION

According to the present invention there is provided a method of making a transmission type, III-V semiconductor photocathode which method includes the steps of providing a semiconductive body containing a layer which is to form the active layer of the photocathode, and preparing a billet of an expansion matched glass, of placing a surface of the billet in contact with a surface of the semiconductive body, which surface of the semiconductive body either is a surface of the active layer or is a surface of a recombinaion inhibition layer of larger band-gap covering said active layer, or is a surface of a glassy passivation layer which either directly covers the active layer or covers the recombination inhibition layer covering the active layer, of applying pressure between the body and the billet while the assembly is heated by a susceptor arrangement of an induction heater which arrangement preferentially heats the semiconductive body to a temperature above the softening point of the glass while leaving the bulk of the billet at a temperaure beneath said softening point, of reducing the temperature of the assembly once the surface of the billet in contact with the semiconductive body has begun to flow, and of annealing the assembly.

DESCRIPTION OF THE PREFERRED EMBODIMENT

The upper limit to the thickness of a GaAs wafer that can be used as a transmission type photocathode is set by the short diffusion length of photon excited electrons in GaAs (typically 10 μm or less). The mechanical properties of GaAs make it difficult, if not impossible, to produce satisfactory self-supporting wafers of the requisite thickness. For this reason the active layer is grown on a temporary substrate which is removed after the active layer has been bonded to its glass permanent substrate.

Figure 1:
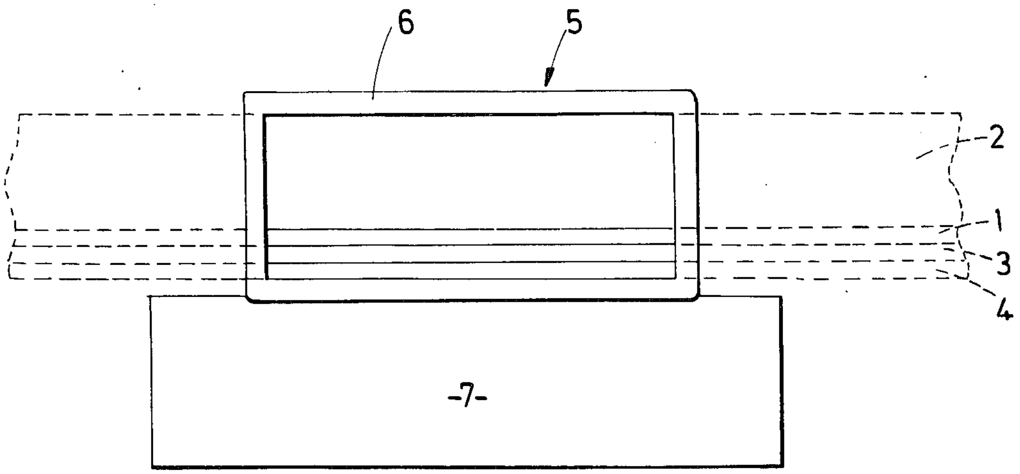
FIG. 1 is a side sectional view of the photocathode of this invention at an early stage in its manufacture.

FIG. 1 shows a thin blocking layer 1 of n-type GaAs, typically 10 μm thick is grown by liquid or vapor phase epitaxy on one face of a p-type GaAs substrate 2 which is typically 250 to 400 μm thick. The function of this blocking layer 1 is to facilitate the control of a later etching process to remove the substrate. Next liquid phase epitaxy is used firstly to grow a p-type GaAs layer 3, and then a p-type GaAlAs layer 4. The GaAs layer 3, which is typically 3 to 6 μm thick, is the active layer of the photocathode, while the GaAlAs layer 4, which is typically 10 μm thick, is provided to reduce recombination at the photon incident surface of the active layer. From this structure is cut a disc 5, typically 19 mm in diameter, which is coated with a silox layer 6.

The next stage of manufacture is the bonding of the semiconductor disc 5 to a glass billet 7, which in the completed structure forms the mechaical support for the active layer. This glass billet must have a thermal expansion coefficient matched with that of the semiconductor material. It is also desirable that it should have a softening point above the maximum desirable photocathode activation temperature (600°–650° C), that it should have a low volatility compatible with ultra-high vacuum ($10^{-10}$ torr) normally used in activation, and that it shall have a low optical loss extending into the near infra-red.

One glass that is suitable is the commercially available dense barium crown glass supplied by Chance Pilkington, St. Asaph, Flintshire, under the designation DBC 606600. A sample of this glass has been examined and found to have a softening point of 690° C and a mean expansion coefficient of about $7.8 \times 10^{-6}$ per °C, over the range 20°–600° C, while a similar expansion coefficient measurement upon GaAs gave an expansion coefficient of $6.4 \times 10^{-6}$ per °C. The expansion match between the glass and the GaAs is therefore not perfect, but discrepancy is in the more favorable direction insofar as it puts the weaker component, the GaAs disc 5, in compression.

A quantity of the glass is placed in a vitreous carbon crucible and outgassed under vacuum at around 1400° C for about 4–5 hours. A slice, typically 2 mm thick and 24 mm in diameter, is cut from this glass to form the billet 7 previously referred to. The billet annealed for an hour in argon, linearly cooled to room temperature over a period of about fifteen hours and then the faces are lapped and polished.

Figure 2:
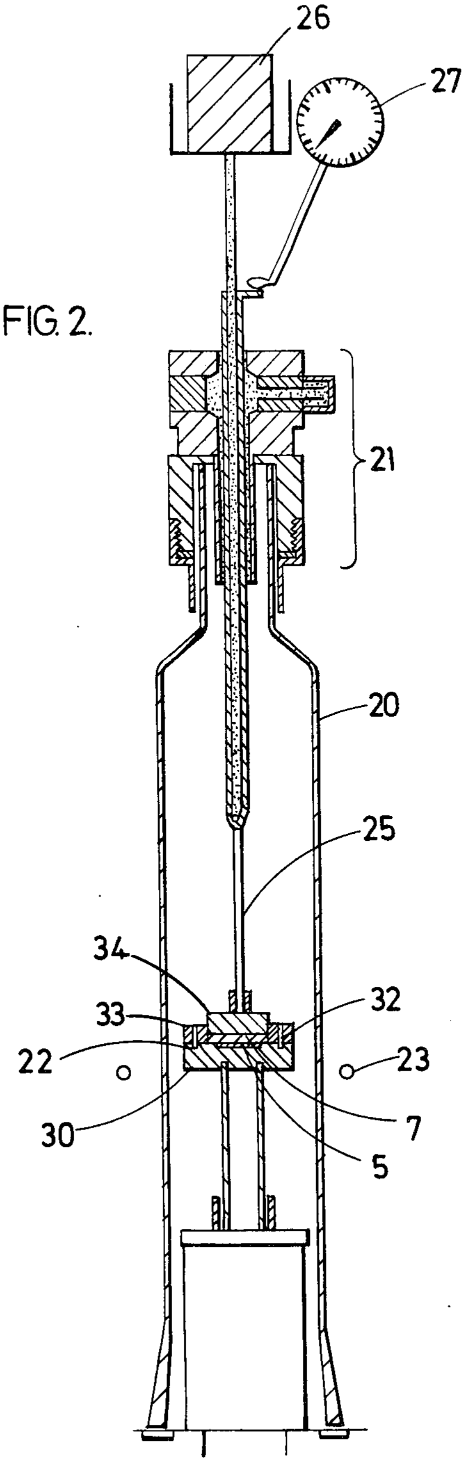
FIG. 2 depicts apparatus used for glass bonding with the embodiment of FIG. 1.

The silox coated semiconductor disc 5 is bonded to the glass billet 7 in the apparatus depicted in FIG. 2. This apparatus consists of a silica vacuum chamber 20 having a grease packed motion feed-through 21, and containing a graphite susceptor arrangement 22 energized by an external r.f. work coil 23. The susceptor assembly is shown in greater detail in FIG. 3.

Figure 3:
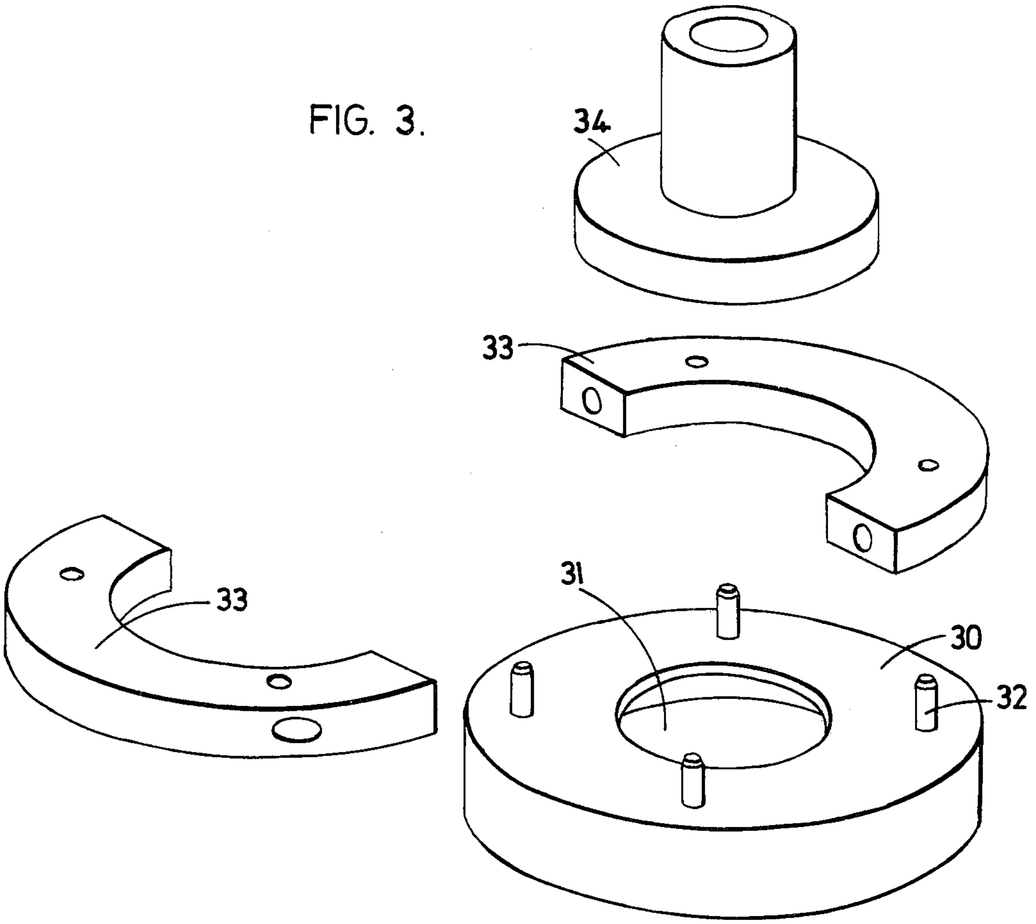
FIG. 3 is an enlarged perspective view of the susceptor arrangement of the glass bonding apparatus of FIG. 2.

The main part of the assembly consists of a susceptor base plate 30 having a recess 31 for locating the disc 5 (not shown in FIG. 3). In this base plate are fixed four tungsten pegs 32 used for locating the two halves of a graphite guide ring 33. The glass billet 7 (not shown in FIG. 3) fits inside the guide ring 33 and is pressed down by a graphite ram 34.

Referring again to FIG. 2, the disc 5 is placed on the base plate with its epitaxially grown layers uppermost. The glass billet 7 is placed, with its polished surface face down, inside the guide ring on top of the disc 5. Next the ram 34 is introduced into the ring on top of the billet. Pressure is applied to the ram via a silica rod 25, which extends through the motion feedthrough 21, and upon which is placed a load 26 typically about 1 kg.

The work coil 23 is positioned relative to the susceptor assembly so that there is a greater coupling of energy into the base plate 30 than into the guide ring 33. In this way the photocathode is heated to a higher temperature than the guide. With this arrangement the assembly may be heated to the point where the disc 5 is hot enough to soften the surface region of the glass 7 with which it is in contact while leaving the bulk of the glass at a lower temperature. This local softening allows the glass surface to take up the contour of the semiconductor disc which is liable to be curved as a result of lattice mismatch across the heterojunction. The softening of the glass is monitored with a Dial gauge 27 measuring the level of the top of the silica rod 25.

The vacuum chamber is pumped out with a diffusion pump (not shown), and then the work coil is energized to raise the temperature of the susceptor assembly until the dial gauge 27 records that the glass has yielded a set amount, typically 50 $\mu$m. At this stage the temperature is run down over about half an hour till the susceptor base reaches the glass annealing temperature (640° C). Typically the glass yields when the temperature of the susceptor base plate and guide ring are at about 830° C and 680° C respectively as measured with an optical pyrometer.

The assembly is maintained at the annealing temperature for about 2 hours before the r.f. power input is slowly reduced to its minimum value over a period of about another 2 hours. At this stage optical bi-refringence tests reveal that there is usually a significant amount of residual inhomogeneous stress in the glass. Therefore the glass billet, with its attached semiconductor disc is transferred, without undue waste of time, to an isothermal annealing furnace where it is heated in argon back to the glass annealing temperature. After an hour or more at this temperature it is slowly reduced to room temperature over a period of about 15 hours.

Figure 4:
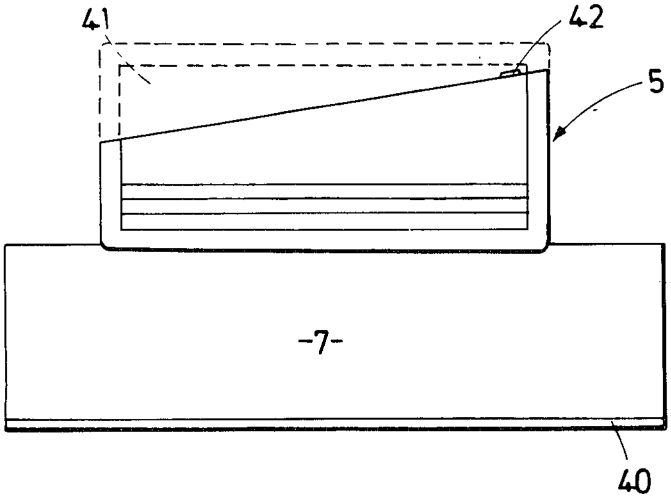
FIG. 4 is a side sectional view of the photocathode at a later stage in its manufacture.

After this bonding and annealing, the optical input face of the glass billet is lapped and polished to remove marks made by the graphite ram. Then an antireflection coating 40 (FIG. 4) of magnesium fluoride is applied by vacuum evaporation to the polished input face. This antireflection layer serve the dual purpose of reducing the radiation loss by reflection and of protecting the polished surface whose surface is otherwise liable to become degraded in the final cleaning-up etch before activation.

Next the silox coated semiconductor disc 5 is lapped with a bias so as to remove the surface coating of silox together with a wedge-shaped portion 41 of the GaAs substrate 2. An indium pellet 42 is alloyed into the substrate at its thickest point.

The next stage of manufacture is the removal by etching of the rest of GaAs substrate material 2 and of the blocking layer 1 to expose the underlying active layer 3. These layers 1 and 2 are removed by the method described in greater detail in the specification accompanying our British Patent Application No. 56517/73. (D. E. Bolger — P. D. Green — E. J. Thrush 4-1-1).

The p-type GaAs substrate material 2 is removed by electrochemical etching. The substrate is placed in an aqueous solution of potassium hydroxide and, by terminal connection with the alloyed indium pellet 42, is made the anode. The cathode is the tip of a tube through which the electrolyte is pumped by a peristaltic pump. The tip of this tube is kept about 1mm from the substrate. Initially it is placed near the edge furthest away from the indium contact where the substrate is thinnest, and as the substrate material is etched away it is slowly scanned over the substrate surface so that the etching advances slowly towards the contact. In this etching process the p-type material is preferentially etched so that the thin underlying n-type blocking layer 1 becomes exposed.

In a modified version of this process, the tube through which the electrolyte is pumped is separate and distinct from the cathode. An insulated wire dips into the electrolyte and has an uninsulated portion extending across the substrate spaced about 1mm from its surface. The uninsulated portion forms the cathode and is fixed in relation to the position of the tip of the tube which lies just behind it so that the electrolyte pumped from the tube rinses both the cathode and the adjacent region of the substrate. The substrate is held vertically in the electrolyte with the indium contact and its associated anode lead at the top, and the cathode is positioned opposite the bottom. The etching proceeds until the underlying n-type blocking layer is exposed, and at the same time the substrate is slowly lowered deeper into the electrolyte so that after the initial exposure of the n-type blocking layer the etching front propagates in the thickness of substrate upwardly towards the indium contact. In the case of etching disc shaped substrates the cathode may be slightly bowed so that it is lowest at its mid-point. With this modified version of the process the amount of attention required during etching is reduced as with substrates typically no more than 1 cm wide etching takes place over the whole width of the substrate and sweeps up towards the anode contact.

The n-type material is next removed by a nonselective bubble etch. This etching process is terminated when the p-type active layer becomes exposed. This is determined by arranging a simultaneous subsidary electrochemical etch whose current flow is monitored while the sample is subjected to intermittent illumination. The principle of operation, which is described in greater detail in the Specification accompanying our British Patent Application No. 56517/73, is that the current is initially limited by the scarcity of holes, and hence the light induced electron-hole pair production produces a current modulation. The modulation disappears when the greater abundance of holes is encountered once the underlying p-type material becomes exposed.

In the above described etching steps the glass billet 7 and the magnesium fluoride anti-reflection layer 40 may be protected from etching by black wax. Carbon is however detrimental to activation of the active layer, and hence it is preferred to follow the removal of the black wax with a brief sulphuric peroxide etch. It is this etching which would be liable to attack the polished surface of the billet if it had not previously been protected with the magnesium fluoride coating 40.

After this etching clean-up stage the photocathode structure is subjected to conventional caesiating activation treatment.

An alternative glass composition is another dense barium crown glass supplied by Chance Pilkington under the designation DBC 589613. A sample of this glass has been examined and found to have a mean expansion coefficient of about $6.8 \times 10^{-6}$ per °C over the range 20°–600° C. This is closer to the expansion coefficient of GaAs, but cannot satisfactorily be outgassed in a plain vitreous carbon crucible as at the temperatures involved it reacts with the material of the crucible. The glass can be outgassed in a platinum crucible but the crucible has then to be cut away to retrieve the glass. Another possibility is to use a vitreous carbon crucible which has been lined with a suitable material to prevent reaction between the glass and the crucible material. This lining may be a thin platinum foil. Cutting of the platinum will still be necessary after the glass has been outgassed, but less platinum is involved. Another feature of using platinum foil instead of a self-supporting platinum crucible is that the resulting glass is not so strained. The differential thermal expansions of platinum and the glass produce a stress field on cooling the glass, but, with a foil, more of this stress is accommodated by strain of the platinum than is the case when a platinum crucible is used.

The use of the blocking layer 1 can be avoided if the GaAs substrate is made of semi-insulating material instead of p-type material. In this case the selective etching technique described in the specification accompanying our British Patent Application No. 56517/73 is replaced by the cathodic inhibition selective etching technique described in the specification accompanying our Patent Application 51574/74 (identified by us as J. Froom — P. D. Greene — H. G. B. Hicks 8-3-2-).

The use of a semi-insulating substrate no longer allows electrical connection for selective etching to be made by way of a contact alloyed into the substrate. This problem is overcome by providing a contact with one of the epitaxially deposited layers.

Figure 5:
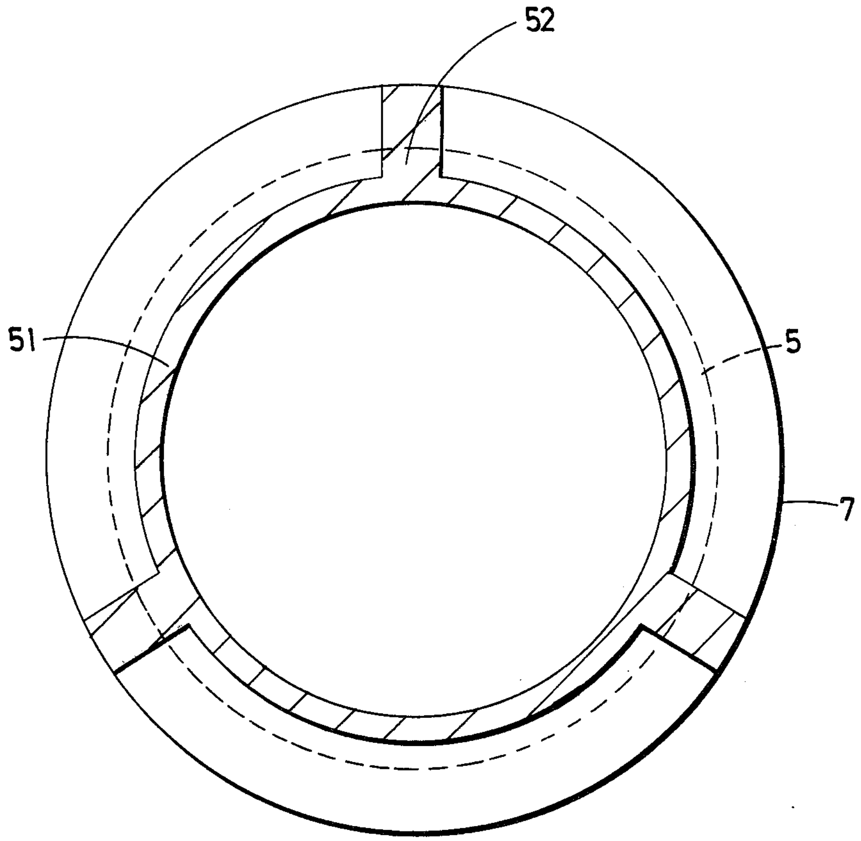
FIG. 5 is a top view of the electrode pattern on the glass billet of an alternative embodiment of the photocathode of FIG. 1.

One method of providing this contact is to provide the glass billet 7 with an electrode pattern 50 (FIG. 5) on the surface that is to be bonded to the semiconductor disc 5. This pattern, which is applied to the billet after its faces have been polished, is a silver paste which may be applied by conventional thick-film silk-screen printing. The pattern consists of an annulus 51 with one or more termination tags 52. Silk screen printing is also used to make an acid resistant etch mask pattern over the epitaxially deposited layers on the silox coated disc 5. The mask protects all of the disc except for an annular region which corresponds in size with the annulus 51. The unprotected region is etched with a hydro-fluoric etch which attacks the silox coating and the GaAlAs to expose the underlying GaAs active layer. After removal of the mask, the disc and billet are bonded and annealed in the same way as before. In this instance however the bonding also causes the electrode pattern 50 to become connected with the active layer. The silox layer covering the substrate is removed in the same way as previously, but in this instance there is no need to apply any bias to the lapping. A terminal connection is made to one of the tags 52, and then this tag and the others are masked with black wax in preparation for the selective removal of the semi-insulating substrate by etching.

A disadvantage of this method of making contact with the epitaxially deposited layers is the tendency for this contact to have a larger resistance than is desirable. An alternative method of making contact with the epitaxially deposited layers involves etching a portion of the substrate through a window in a mask applied to the substrate surface. When one of the underlying layers is thereby exposed an indium pellet is alloyed in substantially the same way as before. Black wax may be used as the mask material. First of all hydrofluoric acid is used to etch through the portion of the silox layer beneath the window. This will not etch the underlying GaAs substrate material, and hence, once this is exposed, the etchant is changed for one which attacks GaAs, but will stop at the GaAlAs recombination reducing layer 4 (FIG. 1). A suitable etchant is 30% hydrogen peroxide in water with the pH adjusted to greater than 6 by the addition of ammonium hydroxide. When the underlying GaAlAs layer is exposed at the foot of the window, an indium pellet is alloyed into its surface, preferably using an aluminum soldering flux to alleviate the oxide problem associated with GaAlAs. Terminal connection is made with this alloyed In pellet which is then masked with black wax in preparation for the selective removal of the semi-insulating substrate by etching.

The etching technique is the same whichever contacting method is employed, and is the cathodic inhibition selective etching technique previously referred to. The structure is immersed in a nonselective etching solution, such as a sulphuric peroxide etch, which is made electrically positive with respect to the terminal connection to the active layer. The active layer is made sufficiently negative with respect to the etch so that when it becomes exposed to the etch the resulting current flow inhibits the action of the oxidizing etch. Typically a current density of about 100 mA is required at room temperature. The semi-insulating material is etched away because its conductivity is so low that there is virtually no current flow at its surface. For further details of this selective etching process reference may be made to the patent specification previously referred to.

The process steps subsequent to the selective etching are unchanged.

The glasses previously referred to have the following compositions expressed in weight %:

| | 606600 | 589613 |
|---|---|---|
| Silica | 32% | 31% |
| Boric Oxide | 16% | 22% |
| Alumina | 5% | 6% |
| Barium Oxide | 45% | 40% |
| Zinc Oxide | 0.9% | 0.4% |
| Lead Oxide | — | 0.2% |
| Arsenious Oxide* | 0.4% | 0.1% |
| Antimony Oxide* | 0.4% | 0.1% |

*computed as being present as the sesqui-oxide.

Another example of a suitable glass from which to construct the billet 7 is given by the material sold by Corning Glass Works under the designation Corning 7056.

A particular feature of this glass is that its softening temperature is such that the bonding can be performed at a temperature about 130° C lower than that used with the Chance Pilkington glasses previously referred to.

It has also been found that outgassing of any of these glasses, prior to bonding, is not necessary if the bonding is carried out in a inert atmosphere, rather than under vacuum. Argon at a pressure of about 1 atmosphere has been found suitable for this purpose. If, however, the completed photocathode is to be housed in a sealed evacuated envelope the use of a billet of outgassed glass may have the advantage of improving the lifetime of the photocathode by reducing any outgassing of the billet after the envelope has been evacuated and sealed.

It may be noted that the bonding and subsequent annealing processes described above are relatively time consuming. Nevertheless it has generally been found that with each of the three described glasses the described bonding process produces inhomogeneous stress which needs to be removed by annealing. However, for reasons which are not fully understood it has been found that at least when using the Corning 7056 glass a modified shorter bonding process produces so much less inhomogeneous stress that the annealing step subsequent to bonding can be dispensed with. In this modified bonding process the components are assembled, and then the induction heater is switched on to take the temperature straight up to that required for bonding. When this is reached, pressure is applied, for instance by hand, to press the semiconductor disc into the surface of the billet and get the required yield (typically 50 μm). Then the pressure is released, the induction heater is switched off and the assembly allowed to cool.

As an aternative to the front surface method of making contact described previously with particulr reference to FIG. 5, one or more short shallow grooves may be machined into the surface of the billet prior to bonding it to the semiconductor disc 5. With this method there is no silk screen printing or masking of the billet or of the disc. The grooves in the billet extend from the perimeter inwardly to just beyond where the edge of the disc will be. The disc, with its silox coating intact, is bonded to the billet, and then a small quantity of hydrofluoric acid is introduced into each groove to enter the region of the groove under the disc where it etches away the silox coating. The etching solution is removed and next the grooves are packed with indium which is then alloyed into the semiconductor material exposed by the etching.

It is to be understood that the foregoing description of specific examples of this invention is made by way of example only and is not to be considered as a limitation on its scope.

What is claimed is:

1. A method of making a transmission type active layer, III-V semiconductor photocathode including the steps of:

- providing a semiconductive body containing a layer which is to form the active layer of the photocathode;
- preparing a billet of glass having a coefficient of expansion matched with said semiconductive body;
- placing a surface of the billet in contact with a surface of the semiconductive body to form an assembly of said billet and body;
- applying pressure between the body and the billet;
- heating the billet and body assembly by a susceptor arrangement of an induction heater to preferentially heat the semiconductive body to a temperature above the softening point of the glass while leaving the bulk of the billet at a temperature beneath said softening point;
- reducing the temperature of the assembly once the surface of the billet in contact with the semiconductive body has begun to flow;
- annealing the assembly at a reduced temperature;
- depositing an anti-reflection coating on an optical input face of said billet opposite said body; and
- removing a porton of said body to expose said active layer.

2. The method of claim 1 wherein the surface of the semiconductive body in contact with the billet is the surface of a recombination inhibition layer of a larger band gap over the active layer.

3. The method of claim 1 wherein the surface of the semiconductive body in contact with the billet is the surface of a glassy passivation layer directly covering the active layer.

4. The method of claim 2 wherein the surface of a glassy passivation layer covers the recombination inhibition layer.

5. The method of claim 1 wherein the billet and body assembly is induction heated under vacuum after having outgassed and annealed the billet.

6. The method of claim 1 wherein the billet and body assembly is induction heated in an atmosphere of argon.

7. The method of claim 1 wherein the billet and body assembly is induction heated in a susceptor arrangement consisting of a plate having a removable annulus fitted to one face of the plate.

8. The method of claim 7 wherein the body is housed in a recess in said one face of the susceptor plate.

9. The method of claim 8 wherein the billet is housed in the annulus and wherein said annulus is formed of at least two parts.

10. The method of claim 1 wherein the semiconductor body includes a p-type active layer epitaxially grown on an n-type blocking layer epitaxially grown on a p-type self-supporting substrate, and wherein a portion of the substrate is removed by electrochemical etching subsequent to annealing to expose the underlying blocking layer.

11. The method of claim 10 wherein electrochemical etchant is pumped through the tip of a tube which forms an electrochemical etching cathode to wash the etching waste products from the surface being etched.

12. The method of claim 10 wherein electrochemical etchant is pumped through a pipe in order to wash the etching waste products from the surface being etched, a wire coupled between the surface being etched and the outlet of said pipe forming the electrochemical etching cathode.

13. The method of claim 12 wherein the exposed portion of the n-type blocking layer is removed by a non-selective etch acting simultaneously with a subsidiary electrochemical etch, wherein the electrochemical etch current is modulated by illuminating the surface being etched with modulated light, and wherein the simultaneous etching is terminated when the active layer becomes exposed as determined by a reduction of the depth of current modulation.

14. The method of claim 1 wherein said semiconductive body includes a p-type active layer grown upon a semi-insulating self-supporting structure, and wherein the removing step includes removing at least part of the semi-insulating substrate by a cathodic inhibition selected etching process in which the p-type active layer is protected from attack by the etching by electrolytic current flow therethrough.

15. The method of claim 14 wherein terminal connection with the active layer for the cathodic inhibition selective etching is made via an electrode on the face of the billet.

16. The method of claim 14 wherein a selective etchant is used to a window through the substrate and the active layer to expose a portion of a GaAlAs layer epitaxially grown on the active layer, and wherein terminal contact is made with the GaAlAs layer through this window for the cathodic inhibition selective etching process.

* * * * *